(12) United States Patent
Siniscalchi

(10) Patent No.: US 9,831,840 B2
(45) Date of Patent: Nov. 28, 2017

(54) AMPLIFIER CIRCUIT AND METHOD FOR ADAPTIVE AMPLIFIER BIASING

(71) Applicant: Texas Instruments Incorporated, Dallas, TX (US)

(72) Inventor: Patrick P. Siniscalchi, Murphy, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 15/143,704

(22) Filed: May 2, 2016

(65) Prior Publication Data

US 2016/0344355 A1    Nov. 24, 2016

Related U.S. Application Data

(60) Provisional application No. 62/163,203, filed on May 18, 2015.

(51) Int. Cl.
*H03F 3/45* (2006.01)
*H03F 1/02* (2006.01)

(52) U.S. Cl.
CPC ....... *H03F 3/45273* (2013.01); *H03F 1/0261* (2013.01); *H03F 3/4521* (2013.01); *H03F 3/45183* (2013.01); *H03F 3/45* (2013.01); *H03F 2203/45112* (2013.01); *H03F 2203/45454* (2013.01); *H03F 2203/45476* (2013.01); *H03F 2203/45508* (2013.01)

(58) Field of Classification Search
CPC ............... H03F 3/45273; H03F 1/0261; H03F 3/45183; H03F 3/4521; H03F 3/45; H03F 3/45076; H03F 3/45085; H03F 3/04; H03F 1/30; H03F 1/302; G05F 3/262; G05F 3/265; G05F 3/267; H03G 3/30
USPC ......................................... 330/253, 257, 261
See application file for complete search history.

(56) References Cited

U.S. PATENT DOCUMENTS

| 5,166,639 A | 11/1992 | Green et al. |
| 5,285,168 A * | 2/1994 | Tomatsu ............... H03F 3/3001 330/253 |
| 5,994,926 A | 11/1999 | Siniscalchi et al. |

(Continued)

FOREIGN PATENT DOCUMENTS

RU    2005132950 A    5/2007

OTHER PUBLICATIONS

Texas Instruments, UCD31386064 Highly Integrated Digital Controller for Isolated Power With 64 kB Program Flash Memory, SLUSB72B; Mar. 2013; Revised Sep. 2014; 91 pages.

(Continued)

*Primary Examiner* — Khanh V Nguyen
(74) *Attorney, Agent, or Firm* — Lawrence J. Bassuk; Charles A. Brill; Frank D. Cimino

(57) ABSTRACT

Disclosed examples include amplifier circuits with a first stage to amplify an input voltage signal according to a first stage gain to provide a first stage output voltage signal, and a second stage to provide an amplifier output voltage signal. A bias circuit provides an amplifier bias current signal to a current mirror circuit coupled with the first stage to control a first stage bias current, and an adjustment circuit to reduce the amplifier bias current signal and increase the first stage gain when the input voltage signal is near a first supply voltage or a second supply voltage.

20 Claims, 6 Drawing Sheets

(56) References Cited

U.S. PATENT DOCUMENTS

| | | | |
|---|---|---|---|
| 6,046,875 | A | 4/2000 | Siniscalchi et al. |
| 6,281,753 | B1 | 8/2001 | Corsi et al. |
| 6,522,200 | B2 | 2/2003 | Siniscalchi |
| 6,985,045 | B2 | 1/2006 | Zhang et al. |
| 7,116,172 | B2 | 10/2006 | Siniscalchi |
| 8,143,944 | B2 | 3/2012 | Siniscalchi et al. |
| 8,269,475 | B2 | 9/2012 | Hester et al. |
| 2005/0099234 | A1* | 5/2005 | Perner ............... H04N 21/4305 330/261 |
| 2005/0184805 | A1* | 8/2005 | Murakami ............. H03F 1/301 330/261 |
| 2006/0091952 | A1 | 5/2006 | Siniscalchi |
| 2006/0238249 | A1* | 10/2006 | Sung ................. H03F 3/45183 330/253 |
| 2008/0061745 | A1* | 3/2008 | Nodo ................. H03F 3/45183 320/162 |
| 2012/0044020 | A1 | 2/2012 | Siniscalchi et al. |
| 2013/0043877 | A1* | 2/2013 | Tang ................... H03F 1/0211 330/261 |
| 2014/0210432 | A1 | 7/2014 | Hsiao et al. |

OTHER PUBLICATIONS

Search Report for PCT/US16/33142, mailed Sep. 1, 2016 (1 page).
English Machine Translation for RU2005132950 (3 pages).

* cited by examiner

AMPLIFIER CIRCUIT AND METHOD FOR ADAPTIVE AMPLIFIER BIASING

REFERENCE TO RELATED APPLICATION

Under 35 U.S.C. §119, this application claims priority to, and the benefit of, U.S. provisional patent application Ser. No. 62/163,203, entitled "ADAPTIVELY BIASED RAIL-TO-RAIL BUFFER AMPLIFIER", filed on May 18, 2015, the entirety of which is hereby incorporated by reference.

BACKGROUND

Buffer amplifiers are used in a variety of applications to interface an input signal to a receiving circuit. For example, opamps are used in voltage-follower configurations with an inverting or 'minus' input terminal connected to an output so that the output voltage ideally tracks the input voltage signal. However, opamps loose gain as their output is driven towards a supply rail, such as ground, because the common-source output transistor goes into triode region operation when the associated drain-source voltage $V_{DS}$ is less than its saturation voltage $VD_{SAT}$. Thus, despite connection in a voltage-follower configuration, the overall amplifier gain is not linear across the entire input signal range, and the gain is less than unity near the supply rails, for example 100 to 200 mV depending on bias and sizing of the output transistor. True unity gain can only be achieved in a middle range and the amplifier circuit suffers from gain error limiting the useful signal range.

SUMMARY

Disclosed examples include amplifier circuits having first and second stages to amplify an input voltage signal and to provide an amplifier output voltage signal. A bias circuit provides an amplifier bias current signal to a current mirror circuit coupled with the first stage to control a first stage bias current. An adjustment circuit reduces the amplifier bias current signal to increase the first stage gain when the input voltage signal is near a supply voltage. The increased first stage gain compensates for the output stage gain loss near the supply rail to enhance gain uniformity across the full output signal range of the amplifier circuit. In certain examples, the adjustment circuit reduces the amplifier bias current signal according to a signal received at a control input. The control input can be connected to an input node of the amplifier circuit to reduce the amplifier bias current signal when the input voltage signal is near a supply voltage in a follower buffer application. In other examples, the control input is connected to the second amplifier stage to receive an amplifier output signal to adaptively bias the first amplifier stage when the output signal is near the supply rail. In certain examples, the first amplifier stage includes a differential amplifier. The adjustment circuit reduces the amplifier bias current signal to increase the first stage gain when the amplifier output voltage signal is near either of a first supply rail voltage or a second supply rail voltage in certain examples.

DETAILED DESCRIPTION

Figure 1:
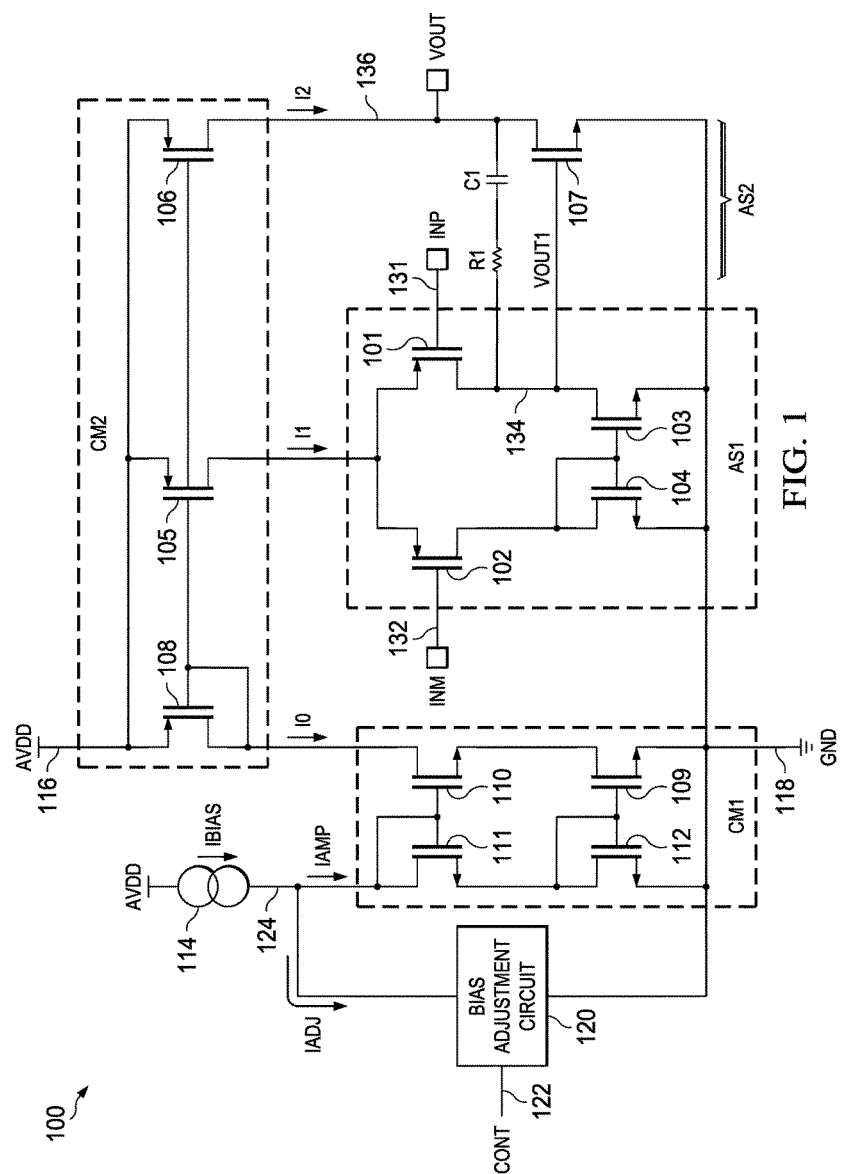
FIG. 1 is a schematic diagram of an adaptively biased dual stage amplifier with an adjustment circuit to change a first amplifier stage gain.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . ". Also, the term "couple" or "couples" is intended to include indirect or direct electrical connection or combinations thereof. For example, if a first device couples to or is coupled with a second device, that connection may be through a direct electrical connection, or through an indirect electrical connection via one or more intervening devices and connections.

Figure 2:
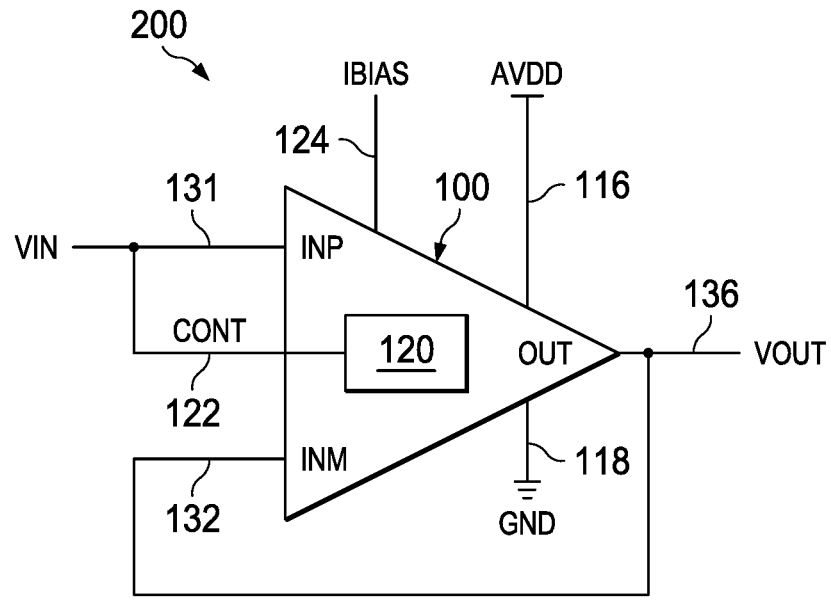
FIG. 2 is a simplified schematic diagram of the amplifier of FIG. 1 connected in a voltage follower buffer amplifier configuration with an adjustment circuit control input connected to an input terminal.

Referring initially to FIGS. 1 and 2, FIG. 1 shows a two-stage buffer amplifier 100 that provides adaptive biasing using an adjustment circuit 120 (BIAS ADJUSTMENT CIRCUIT in FIG. 1). The adjustment circuit 120 facilitates improved output drive near a supply voltage, in this case ground node 118 GND. FIG. 2 shows an amplifier circuit 200 with the amplifier 100 connected as a voltage follower buffer amplifier in which an adjustment circuit control input 122 (CONT) is connected to an input terminal 131. Disclosed examples provide intelligent amplifier circuit biasing and gain control to counteract output stage gain loss near one or more supply voltages or rails, such as AVDD at node 116 and/or GND at node 118 in FIG. 2. The example in FIG. 2 provides follower type buffer amplifier applications of the disclosed amplifier circuit 100. The concepts of the present disclosure can be used in other opamp circuits and amplifier configurations.

The amplifier circuit 100 in FIG. 1 includes a first amplifier stage AS1 that amplifies an input voltage signal according to a first stage gain to provide a first stage output voltage signal VOUT1. A second amplifier stage circuit AS2 includes an output transistor 107 to amplify the first stage output signal VOUT1 to provide an amplifier output voltage signal VOUT. The first amplifier stage circuit AS1 in this example includes transistors 101-104 that form a common source differential pair in an amplifier circuit to amplify a differential input voltage signal from first and second amplifier input terminals or nodes 131 (plus input INP) and 132 (minus input INM) according to a first stage gain to provide a single-ended first stage output voltage signal VOUT1 at an output node 134. In other examples, the first stage AS1 can be a fully differential amplifier stage providing a differential output signal. In this example, p-channel transistors 101 and 102 form a differential pair and are preferably matched with one another. The transistors 101 and 102 have source terminals connected to one another at a common source node to receive a first stage bias current I1. Drain terminals of the transistors 101 and 102 are connected to an n-channel current mirror load formed by transistors 103 and 104. The drain of transistor 101 is connected to a first stage output node 134 to provide the VOUT1 signal to the gate terminal of the second stage output transistor 107. The source of the second stage output transistor 107 is connected to the ground rail GND and the drain of the transistor 107 provides the amplifier output voltage signal VOUT at an amplifier output node 136. A resistor R1 and a capacitor C1 are connected in series with one another to form a frequency compensation circuit between the first stage output node 134 and the amplifier output node 136. Although the illustrated examples include first and second stages directly connected to one another, other examples are possible including three or more stages, in which a final output stage directly or indirectly amplifies a first stage output signal, whether single-ended or differential.

The amplifier 100 also includes a bias circuit with a current source 114 coupled between a positive supply voltage or rail AVDD and an input node 124 of a first current mirror circuit CM1. The current source 114 provides a bias current signal IBIAS to the current mirror input node 124. The current signal IBIAS is selectively modified by an adjustment current IADJ diverted from the node 124 by the adjustment circuit 120. The resulting current IAMP=IBIAS−IADJ is provided to the first minor circuit CM1. The circuit CM1 includes transistors 109-112 to provide a mirrored current I0 to a second current mirror circuit CM2. Any suitable first current mirror circuit can be used which receives the IAMP current signal and provides a proportionate current signal I0. In this example, the transistors 111 and 112 are connected between the current mirror input node 124 and the second supply voltage or rail GND. The gate and drain of the transistor 111 are connected to one another and to the gate of the transistor 110 to mirror the current flowing through the transistor 111 to the transistor 110. Similarly, the gate and drain of the transistor 112 are connected to one another and to the gate of the transistor 109. The transistors 109 and 110 are connected in series with one another between the second current mirror circuit CM2 and GND. In another example, the transistors 109 and 112 can be omitted, with the source terminals of the transistors 110 and 111 being connected to GND.

The second current mirror circuit is coupled with the upper supply voltage AVDD, and includes a p-channel transistor 108 connected between AVDD and the drain of the transistor 110 to conduct the current I0. The gate and drain of the transistor 108 are connected to the gates of p-channel transistors 105 and 106, and the source terminals of the transistors 105 and 106 are coupled to AVDD. The transistor 105 mirrors the current I0 flowing in the transistor 108 to provide the first bias current I1 to the sources of the first stage transistors 101 and 102 to bias the first amplifier stage AS 1 according to the amplifier bias current signal IAMP flowing into the first current mirror circuit CM1. The ratio of the current signals I0 and I1 is set according to the relative sizes of the transistors 108 and 105. Similarly, the gate of the current mirror transistor 106 is connected to the gate of the transistor 108. The transistor 106 mirrors the current signal I0 from the first current mirror circuit CM1 to provide a second stage bias current signal I2 to the drain of the second amplifier stage output transistor 107, which is proportional to I0.

The adjustment circuit 120 reduces the amplifier bias current signal IAMP by diverting the adjustment current IADJ from the node 124. This adjustment reduces the first amplifier stage bias current I1 through operation of the current mirror circuitry CM1 and CM2. This reduction in the first stage bias current I1, in turn, increases the first amplifier stage gain. The adjustment circuit 120 adjusts the amplifier bias current IAMP when the amplifier output voltage signal VOUT is near the second supply rail voltage GND. In the example of FIG. 1, the adjustment circuit 120 operates according to a control input signal CONT.

The low frequency gain $A_{V1}$ of the first amplifier stage AS1 is given by the following equation (1):

$$A_{V1} = -gmM1/(gdsM1+gdsM3), \quad (1)$$

where M1 is the first stage amplifier transistor 101, M3 is the transistor 103, and the transconductance gm and gds are given by the following equations (2) and (3):

$$gm \approx (2\mu_p C_{ox}(W/L)I_D)^{0.5}, \quad (2)$$

$$gds \approx \lambda I_D. \quad (3)$$

where gds is the slope of the $I_D$ curve as a function of the drain-source voltage $V_{DS}$ in the saturation region, and λ is the channel length modulation parameter that varies with the gate length of the transistor. As a result, the first stage gain $A_{V1}$ is inversely proportional to the square root of $I_D$.

With respect to the second stage AS2, the second stage gain $A_{V2}$ when the transistor 107 is operating in the saturation region is given by the following equation (4), where M6 is the transistor 106 and M7 is the transistor 107:

$$A_{V2} = -gmM7/(gdsM7+gdsM6), \quad (4)$$

However, as the OUTPUT nears ground, the transistor 107 will go into the triode region of operation and the transconductance gm of the output transistor 107 is given by the following equation (5):

$$gm \approx \mu_n C_{ox}(W/L)V_{ds}, \quad (5)$$

where $V_{ds}$ is the output voltage VOUT. At the transition from saturation to triode region operation, the transconductance gm of the second stage gain decreases roughly linearly with output voltage VOUT. The gds of the upper current mirror transistor 106 decreases by the square root of the current I2, and the gds of the output transistor 107 increases according to the following equation (6):

$$gds = \mu_n C_{ox}(W/L)(V_{gs}-V_T-V_{ds}). \quad (6)$$

The overall effect on the second stage gain is dependent upon the method for decreasing IAMP. As a buffer amp (e.g., as shown in FIG. 2 below), the closed loop gain is given by the following equation (7):

$$A = (A_{V1}A_{V2})/(1+A_{V1}A_{V2}). \quad (7)$$

For high values of the first and second stage gains $A_{V1}$ and $A_{V2}$ in equation (8), the gain of the buffer is approximately unity. However, if the product of $A_{V1}$ and $A_{V2}$ is sufficiently low (e.g., when the output voltage VOUT is low), the gain of the buffer is <1. Also, low gain affects the output impedance of the buffer as per the following equation (8), where the amplifier circuit output impedance should ideally be low:

$$Rout_{buffer} = OpampR0/(1+A_{V1}A_{V2}). \quad (8)$$

The adjustment circuit 120 adjusts the amplifier bias current IAMP to counteract this gain loss when the amplifier output voltage signal VOUT is near the second supply rail voltage GND.

FIG. 2 shows an amplifier circuit 200 with the amplifier 100 connected as a voltage follower buffer amplifier in which an adjustment circuit control input 122 (CONT) is connected to an input terminal 131 (INP). As INP approaches ground, the adjustment current IADJ increases, which decreases IAMP and decreases the first stage bias I1 in FIG. 1, which, in turn, increases the gain of the simple differential pair first stage AS1. This increase in gain allows the buffer amplifier to drive more effectively near ground. The amplifier 100 in this case is configured as a voltage-follower buffer, and the input voltage VIN should equal the output voltage VOUT. In operation, as the input voltage VIN approaches a supply rail, such as the ground voltage GND at node 118, a part of the input bias current IBIAS for the amplifier 100 is diverted from the first stage AS1 so that the as the amplifier output voltage VOUT at the node 136 approaches GND. This, in turn, increases the gain of the first stage AS1 to compensate for gain lost at the output stage as the common-source output stage transistor 107 enters the triode region. The higher first stage gain gives the amplifier 100 the ability to drive the output closer to the rail or ground. In operation in one example, the amplifier 100 can drive voltage follower amplifier can drive the output to less than 20 mV from the supply rail or ground. In contrast, an amplifier using a similar output transistor, without the bias current adjustment implemented using the circuit 120, can only provide unity gain about 100 to 200 mV away from the supply rails. The disclosed examples thus extend the signal range of the amplifier circuit 200 to practically include the supply voltages or rails. The solution, moreover, is achieved without addition of a negative supply rail to drive the output signal down to ground.

Figure 3:
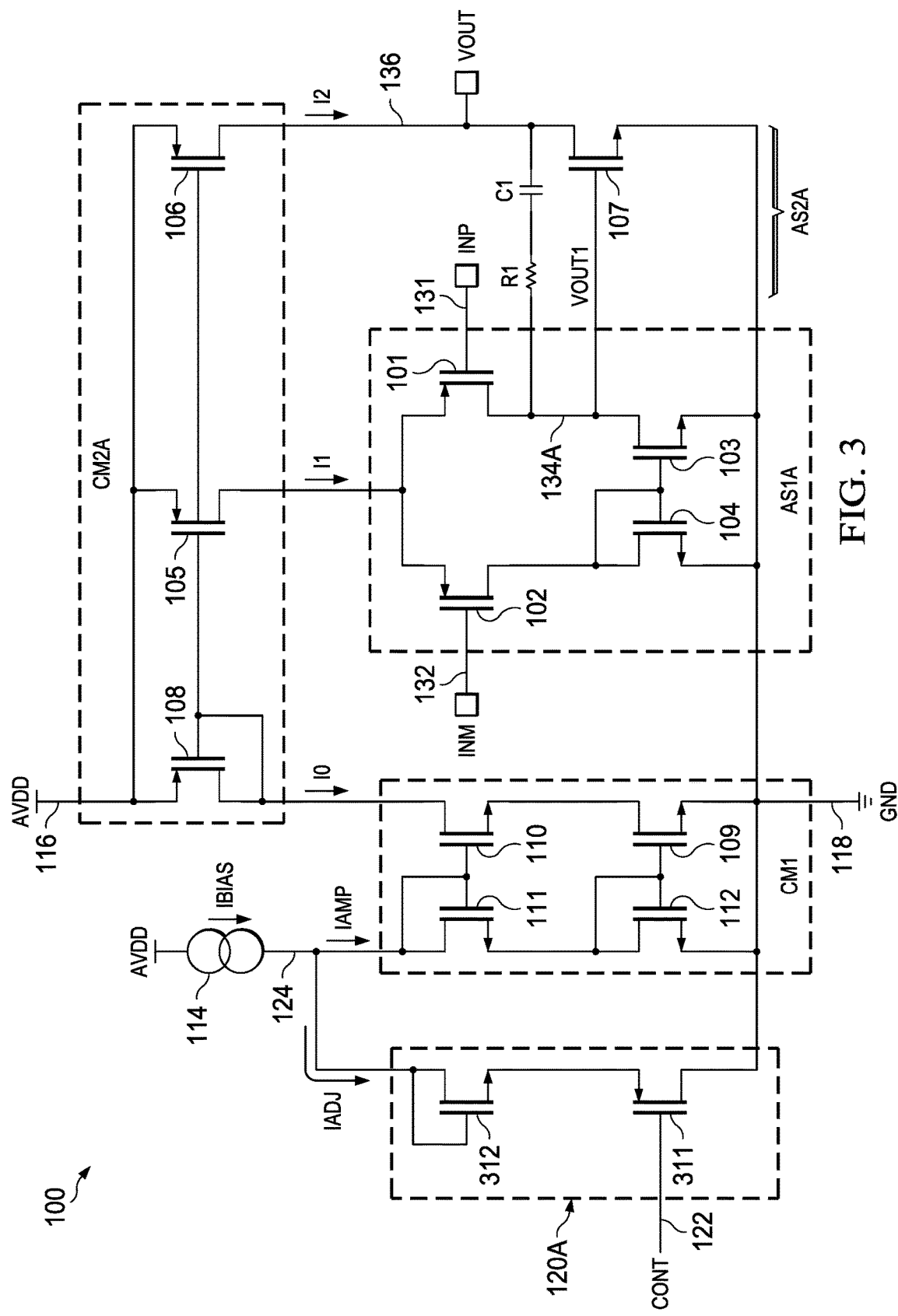
FIG. 3 is a schematic diagram of the amplifier of FIG. 1 including a p-channel first stage differential amplifier with a first example adjustment circuit.

FIG. 3 shows an example of the amplifier 100 of FIG. 1 including a p-channel first stage differential amplifier with a first example adjustment circuit 120A. As in FIG. 1 above, the amplifier 100 includes a first stage AS1A with an output node 134A and transistors 101-104 biased by a current signal I1 from a second current mirror circuit CM2A with transistors 105, 106 and 108. A second amplifier stage AS2A includes an output transistor 107 as previously described. An adjustment circuit 120A in this example includes transistors 311 and 312 coupled in series with one another between the current mirror input node 124 and the supply rail GND. In another possible implementation, a third adjustment circuit transistor (not shown) can be included in series between the transistors 311 and 312. The n-channel transistor 312 is connected in series with the p-channel control transistor 311 between the node 124 and GND. The adjustment circuit 120A in FIG. 3 is connected in parallel with the first current mirror circuit CM1 another between the current source 114 and a supply rail node 118. The first adjustment circuit transistor 311 includes a gate control terminal connected to the control input 122 to receive the control input signal CONT, and the second transistor 312 is diode connected such that the voltage of the current mirror input node 124 is the voltage at the source of the transistor 311 plus the gate-source voltage VGS of the second transistor 312. In another example, two transistors 312 and a third diode connected transistor (not shown) are of substantially identical dimensions, and the gate-source voltages VGS of the second and third transistors is designed to be less than the VGS of the diode connected current mirror transistor 111. Where the circuit 120A includes only the transistors 311 and 312, the VGS of the adjustment circuit transistors 311 and 312 are designed with a sum of VGSs less than the sum of the VGSs of the current mirror transistors 111 and 112. In other examples, such as where the transistors 109 and 112 are omitted, the gate-source voltage or voltages of the diode connected transistor or transistors of the adjustment circuit 120A are omitted and the VGS of 311 is designed to be less than the gate-source voltage or voltages of the diode connected transistor of the first current mirror circuit CM1.

In operation, when the voltage of the control signal CONT is level at which the second stage output transistor 107 is operating in the saturation region, the p-channel adjustment circuit transistor 311 pulls the voltage at the source of the transistor 312 toward the GND supply voltage level. In this condition, the voltage across the adjustment circuit transistor 312 is less than the voltage at the current mirror input circuit node 124 (the voltage across the transistors 111 and 112), and thus the adjustment current IADJ is essentially zero. Once the voltage of the control signal CONT is close enough to the lower supply voltage GND, and the transistor 311 is sufficiently on, the adjustment circuit 120A begins to divert a non-zero current IADJ from the current mirror input node 124. This lowers the amplifier current IAMP, and the first stage bias current I1 decreases accordingly. This increases the first stage gain, and causes the first stage output voltage VOUT1 to increase. The second stage output transistor 107 can thus drive the amplifier output voltage VOUT closer to the lower supply voltage GND. The magnitude of the current IADJ increases (and hence the amount of first stage gain increases) as the control voltage signal CONT gets closer to the supply voltage GND to further turn on the transistor 311. In this manner, the adjustment circuit 120A operates according to the control input signal CONT to reduce the amplifier bias current signal IAMP to increase the first stage gain when the amplifier output voltage signal VOUT is near the supply rail voltage GND. The addition of the adjustment circuit 120A in certain examples involves only two or three additional transistors.

Moreover, the control input 122 can be connected to the input node 131 in voltage-follower configurations to provide a suitable input to control the adjustment circuit 120 for enhanced gain uniformity by counteracting gain errors when the output voltage VOUT is near the supply voltage GND. In such a configuration, as shown in FIG. 2 above, the first stage gain increase only occurs when the input (and output) is near the supply rail or ground GND, and the buffer amplifier performance is unchanged when the input and output are not near the supply rails. As discussed below in connection with FIG. 6, the control input terminal or node 122 can alternatively be connected to the output node 136 for similar operation in voltage-follower configurations, and also for other opamp circuit configurations, such as inverting amplifiers, etc.

Figure 4:
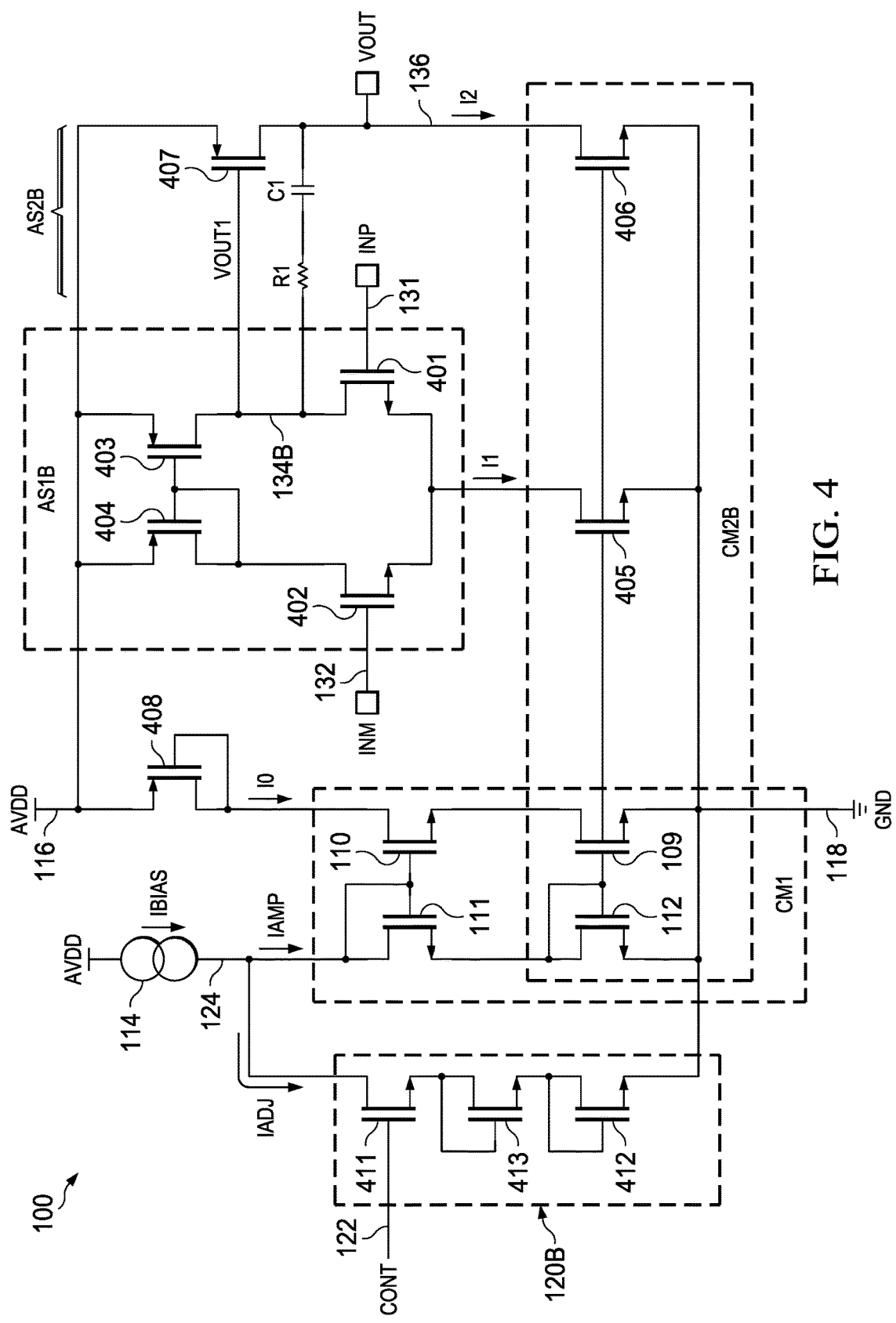
FIG. 4 is a schematic diagram of another example amplifier including a first stage with an n-channel differential amplifier and a second example adjustment circuit.

FIG. 4 shows another example two-stage amplifier 100 with adaptive biasing using an adjustment circuit 120B for improved output drive near the upper supply voltage AVDD. In this case, the amplifier 100 includes a first amplifier stage AS1B with n-channel transistors 401 and 402 receiving input signals from input terminals 131 and 132 (INP and INM), along with a second amplifier stage including a p-channel output transistor 407, a bias circuit with a source 114 and first current mirror circuit CM1 as described above, with a second current mirror circuit CM2B including transistors 405 and 406 to conduct bias currents I1 and I2 from the respective first and second output stages to the GND supply voltage or rail. The amplifier 100 in FIG. 4 generally operates in complementary fashion to the amplifier in FIG.

3. The first amplifier stage circuit AS1B includes transistors 401-404 forming a common source differential amplifier circuit to amplify a differential input voltage signal according to a first stage gain, and to provide a single-ended first stage output voltage signal VOUT1 at a first stage output node 134B. In other examples, the first amplifier stage circuit AS1B can provide a differential for stage output voltage signal.

The n-channel transistors 401 and 402 form a differential pair and are preferably matched with one another, with source terminals connected to one another at a common source node to conduct a first stage bias current I1 from the current mirror transistor 405, and p-channel transistors 403 and 404 provide a current mirror load for the n-channel differential pair 401, 402. The output transistors 109 and 110 of the first current mirror circuit CM1 are connected in series with a p-channel transistor 408 between the GND and AVDD supply rails, and the gate terminals of the transistors 405 and 406 in the second current mirror circuit CM2B are connected to the gates of the transistors 109 and 112. In this manner, the amplifier current IAMP establishes the currents I1 and I2 for biasing the dual stage amplifier. The current signal I1 biases the first stage AS1B via transistor 405, and the mirror circuit transistor 406 provides a bias current signal I2 to bias the output p-channel transistor 407. The current source 114 provides a bias current signal IBIAS to the current mirror input node 124, and the adjustment circuit 120B selectively modifies the amplifier bias current IAMP by diverting an adjustment current IADJ from the node 124 according to a control signal CONT as previously described. The amplifier bias current IAMP=IBIAS−IADJ is provided to the first mirror circuit CM1.

The adjustment circuit 120B in this case includes an n-channel control transistor 411 connected in series with one or more diode connected n-channel transistors 412 and 413. In another possible implementation, the third adjustment circuit transistor 413 can be omitted, with transistors 411 and 412 connected between GND and the node 124. In the illustrated example, the circuit 120B lowers the current IAMP to decrease I1 and increase the first stage amplifier gain as the control signal voltage CONT approaches AVDD. As in the example of FIG. 3, the adjustment circuit 120B in FIG. 4 is connected in parallel with the first current mirror circuit CM1 another between the current source 114 and GND. The gate of the transistor 411 is connected to the control input 122 to receive the control input signal CONT, and the transistors 412 and 413 are diode connected such that the voltage of the current mirror input node 124 is the voltage at the drain of the transistor 411 plus the sum of the gate-source voltages VGS of the transistors 412 and 413. In one example, the transistors 412 and 413 are of substantially identical dimensions, and the gate-source voltages VGS of the transistors 412 and 413 is designed to be less than the VGS of the diode connected current mirror transistors 111 and 112. In other examples, for instance where the transistors 109 and 112 are omitted, the gate-source voltage or voltages of the diode connected transistor or transistors of the adjustment circuit 120B are designed to be less than the gate-source voltage or voltages of the diode connected transistor or transistors of the first current mirror circuit CM1.

In FIG. 4, when the voltage of the control signal CONT is at a level at which the second stage output transistor 407 is operating in the saturation region, the transistor 411 remains off and the adjustment current IADJ is zero while the control signal voltage CONT is less than the sum of the VGS voltages of the transistors 412 and 413 plus the threshold voltage VT of the control transistor 411. Once the control signal voltage is greater than or equal to the sum of the VGS voltages of the transistors 412 and 413 plus the threshold voltage VT of the control transistor 411, the transistor 411 turns on and draws a non-zero adjustment current IADJ from the current mirror input node 124 to decrease IAMP. As with the previous examples, this decrease in IAMP decrease the first amplifier stage bias current I1 to increase the first stage gain. In this manner, as the second stage output transistor 407 transitions from saturation region operation into triode region operation, the adjustment circuit 120B compensates for the second stage gain loss by enhancing the first stage gain. The amount of the diverted current IADJ increases (and hence the amount of first stage gain increases) as the control voltage signal CONT gets closer to the supply voltage AVDD to further turn on the transistor 411.

Figure 5:
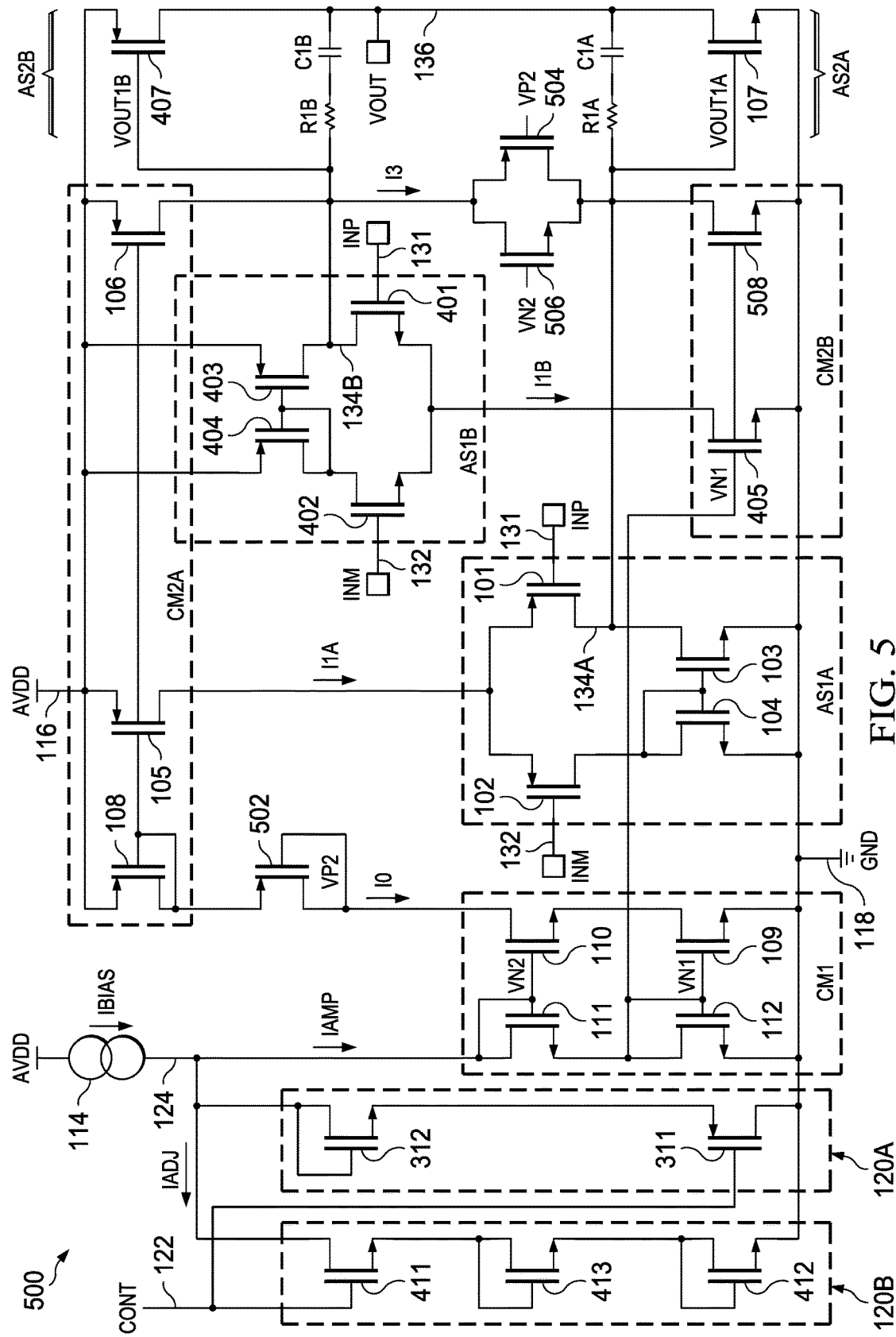
FIG. 5 is a schematic diagram of a rail-to-rail amplifier including a first stage with p-channel and n-channel differential amplifiers and a third example adjustment circuit.

FIG. 5 shows a rail-to-rail amplifier example 500 including a pair of first amplifier stages AS1A and AS1B with p-channel and n-channel differential amplifiers. The first stage AS1A includes transistors 101-104 and an output node 134A, and the circuit AS1A operates as described above in connection with FIG. 3. The first stage AS1B includes transistors 401-404 and an output node 134B as described above in connection with FIG. 4. The amplifier 500 also includes a third example adjustment circuit including a pair of adjustment circuits 120A and 120B as respectively described above in connection with FIGS. 3 and 4. The amplifier 500 includes a first current mirror circuit CM1 including transistors 109-112 as described above, which receives and mirrors a current signal IAMP from an input node 124 to provide a current signal I0 flowing from AVDD through two series connected transistors 108 and 502.

A second current mirror circuit CM2A provides a first stage bias current I1A to the first stage circuit AS1A. An additional current mirror circuit CM2B includes a transistor 405 as described above in FIG. 4 and a transistor 508, each having a gate connected to receive the gate voltage VN1 of the first current mirror transistors 109 and 112. The mirror circuit CM2B draws a current I1B from the common source connection of transistors 401 and 402 in the first stage AS1B, as described above in connection with FIG. 4. In addition, the amplifier 500 includes a floating current bias circuit formed by a p-channel transistor 504 and an n-channel transistor 506 connected between the upper and lower mirror transistors 106 and 508 to conduct a current I3 based on the amplifier bias current IAMP. The gate of the transistor 506 is connected to receive a voltage signal VN2 from the gates of the transistors 110 and 111 of the first current mirror circuit CM1. The gate of the transistor 504 is connected to receive a voltage signal VP2 from the gate of the transistor 502.

The first amplifier stage circuit AS1A amplifies the differential input signal at the terminals 131 (INP) and 132 (INM) by the first stage gain to provide an output signal VOUT1A at a node 134A to control the gate of the lower n-channel output transistor 107, with a frequency compensation circuit formed by a resistor R1A and a capacitor C1A connected between the stage output node 134A and the amplifier output node 136. The other first amplifier stage circuit AS1B amplifies the differential input signal at the terminals 131 (INP) and 132 (INM) by the first stage gain to provide an output signal VOUT1B at a node 134B. This signal VOUT1B controls the gate of the upper p-channel output transistor 407 as described above in connection with FIG. 4. Another frequency compensation circuit is formed by a resistor R1B and a capacitor C1B connected between the stage output node 134B and the amplifier output node 136. The second stage includes a stage AS2A formed by the transistor 107, and an output stage AS2B including the upper output transistor 407.

In operation, when the control signal CONT is in a middle range between GND and AVDD where both output transistors 107 and 407 are operating in the saturation region (e.g., the output voltage VOUT is not near AVDD or GND), the adjustment circuit transistors are off and the rail-to-rail amplifier 500 is biased according to the current IBIAS from the current source 114 (IAMP=IBIAS, and IADJ is zero).

When the control input voltage is close to GND, the transistor 311 is fully on and the adjustment circuit 120A begins to divert a non-zero current IADJ from the current mirror input node 124. This lowers the amplifier current IAMP and the current I1A, increases the gain of the first stage AS1A, and causes the first stage output voltage VOUT1 to increase to lower VOUT, thereby allowing the amplifier 500 to drive the output near GND. When the control signal voltage CONT is greater than or equal to twice the VGS voltages of the transistors 412 and 414 plus the threshold voltage VT of the control transistor 411 in the adjustment circuit 120B, the transistor 411 turns on and draws a non-zero adjustment current IADJ from the current mirror input node 124 to decrease IAMP. This decreases the bias current BB and increases the first stage gain of the circuit AS1B as described above in connection with FIG. 4. The adjustment circuitry 120A and 120B thus adaptively bias the output stages to drive the output voltage VOUT closer to both AVDD and GND by selectively diverting bias current IADJ away the current mirror input node 124 when the control signal voltage CONT close to AVDD or GND.

Figure 6:
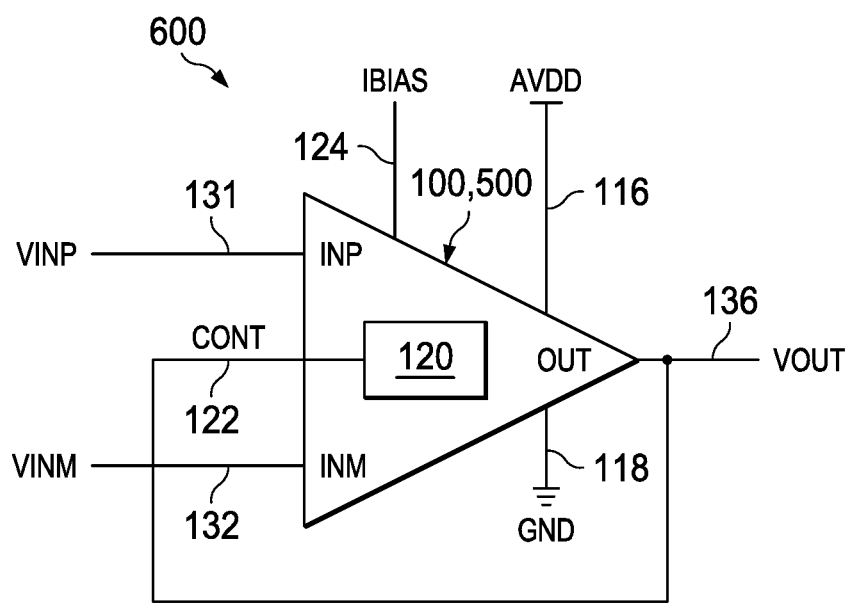
FIG. 6 is a simplified schematic diagram of the amplifier of FIG. 1 with an adjustment circuit control input connected to the amplifier output terminal.

FIG. 6 shows another amplifier circuit configuration 600 including an amplifier 100 or 500 as described above. In this example, the adjustment circuit control input terminal 122 is connected to the second amplifier stage AS2 at the output terminal 136. In this circuit 600, the adjustment circuitry is directly controlled according to the output voltage VOUT. The circuit 600 can be configured to operate as a voltage-follower buffer, for example, by connecting the output node 136 to the minus input node 132, to follow the voltage applied to the plus input node 131. In other examples, resistors, capacitors and/or other feedback components can be connected to implement a variety of opamp circuit configurations, where the adjustment circuitry 120 operates to enhance the capability to drive the output voltage VOUT close to one or both of the supply voltages AVDD and/or GND.

Figure 7:
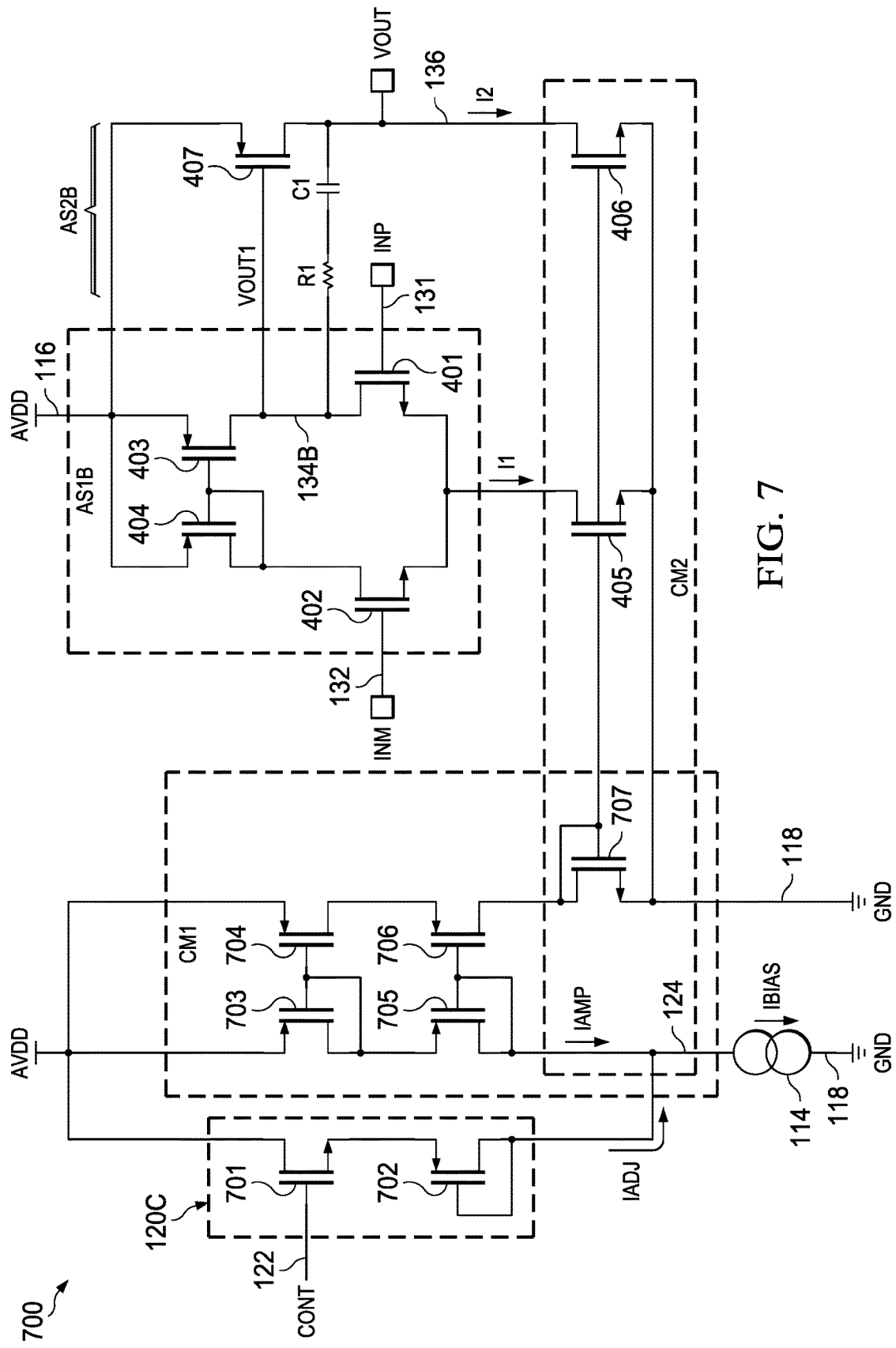
FIG. 7 is a schematic diagram of another example amplifier including a first stage with an n-channel differential amplifier and an adjustment circuit.

FIG. 7 shows another example amplifier 700 including a first stage AS1B, a second stage AS2B generally as described above in connection with FIG. 4. In addition, the circuit 700 includes an adjustment circuit 120C and first and second current mirror circuits CM1 and CM2. In this example, a current source 114 is connected between the current mirror circuit CM1 and GND. The adjustment circuit 120C and the first current mirror circuit CM1 are connected between the positive supply rail AVDD and the current mirror input node 124. The adjustment circuit in this example includes a first transistor 701 with a gate connected to receive the control signal CONT, and a diode-connected second (p-channel) transistor 702 coupled between the source of the transistor 701 and the node 124. The first current mirror circuit CM1 includes p-channel transistor 703-706, and a transistor 707 which mirrors an amplifier current IAMP to create first and second stage by his currents I1 and I2 via transistors 405 and 406, respectively. In this example, the bias current IBIAS from the current source 114 is generally constant, and the adjustment circuit 120C can selectively reduce the mirror circuit current IAMP by sourcing an adjustment current IADJ to the node 124 when the control signal CONT is at or near AVDD.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. A circuit, comprising:
   an amplifier circuit, including:
   an input to receive an input voltage signal,
   a first amplifier stage circuit to amplify the input voltage signal according to a first stage gain to provide a first stage output voltage signal, and
   a second amplifier stage circuit, including an output transistor to amplify the first stage output voltage signal to provide an amplifier output voltage signal; and
   a bias circuit, including a current source coupled to an input node of a first current mirror circuit to provide an amplifier bias current signal to set the first stage gain of the first amplifier stage circuit; and
   an adjustment circuit, including a control input coupled to the input voltage signal to receive a control input signal, the adjustment circuit being coupled to the input node of the first current mirror circuit and operative according to the control input signal to increase the first stage gain when the amplifier output voltage signal is near to a supply rail voltage.

2. The circuit of claim 1, wherein the input includes a first input node and a second input node to receive a differential input voltage signal;
   wherein the first amplifier stage circuit includes a plurality of transistors forming a differential amplifier circuit to amplify the differential input voltage signal according to the first stage gain to provide the first stage output voltage signal;
   wherein the amplifier circuit includes a second current mirror circuit coupled with the first amplifier stage circuit to control a first bias current flowing in the differential amplifier circuit according to the amplifier bias current signal; and
   wherein the adjustment circuit reduces the amplifier bias current signal to increase the first stage gain according to the control input signal.

3. The circuit of claim 2, wherein the current source provides a bias current signal to the input node of the first current mirror circuit; and
   wherein the adjustment circuit selectively sinks an adjustment current signal from the input node of the first current mirror circuit according to the control input signal to reduce the amplifier bias current signal.

4. The circuit of claim 3, wherein the adjustment circuit includes first and second transistors connected in series with one another between the input node of the first current mirror circuit and a supply rail node;
   wherein the first transistor includes a first control terminal connected to the control input to receive the control input signal; and
   wherein the second transistor includes a drain terminal and a second control terminal connected to one another.

5. The circuit of claim 3, wherein the control input is connected to one of the first input node and the second input node.

6. The circuit of claim 3, wherein the control input is connected to the second amplifier stage to receive the amplifier output voltage signal.

7. The circuit of claim 1, wherein the adjustment circuit includes first and second transistors connected in series with one another between the current source and a supply rail node;
wherein the first transistor includes a first control terminal connected to the control input to receive the control input signal; and
wherein the second transistor includes a second drain terminal and a second control terminal connected to one another.

8. The circuit of claim 7, wherein the adjustment circuit includes a third transistor connected between the first and second transistors, the third transistor including a third drain terminal and a third control terminal connected to one another.

9. The circuit of claim 7, wherein the amplifier circuit includes a second current mirror circuit coupled with the first amplifier stage circuit to control a first bias current flowing in the differential amplifier circuit according to the amplifier bias current signal, the second current mirror circuit including diode connected first and second current mirror transistors connected in series with one another between the current source and a supply rail node; and
wherein a gate-source voltage of the first and second transistors of the adjustment circuit is less than a sum of gate-source voltages of the first and second current mirror transistors.

10. The circuit of claim 1, wherein the amplifier circuit includes a second current mirror circuit coupled with the first amplifier stage circuit to control a first bias current flowing in the first amplifier stage circuit according to the amplifier bias current signal; and
wherein the current source provides a bias current signal to the input node of the first current mirror circuit; and
wherein the adjustment circuit selectively sinks an adjustment current signal from the input node of the first current mirror circuit according to the control input signal to reduce the amplifier bias current signal.

11. The circuit of claim 10, wherein the adjustment circuit includes first and second transistors connected in series with one another between the input node of the first current mirror circuit and a supply rail node;
wherein the first transistor includes a first control terminal connected to the control input to receive the control input signal; and
wherein the second transistor includes a drain terminal and a second control terminal connected to one another.

12. The circuit of claim 1, wherein the control input is connected to one of the first input node and the second input node.

13. The circuit of claim 1, wherein the control input is connected to the second amplifier stage to receive the amplifier output voltage signal.

14. The circuit of claim 1, wherein the adjustment circuit reduces the amplifier bias current signal to increase the first stage gain when the amplifier output voltage signal is near either of a first supply rail voltage or a second supply rail voltage according to the control input signal.

15. An amplifier circuit, comprising:
a differential first amplifier stage circuit to amplify a differential input voltage signal according to a first stage gain to provide a first stage output voltage signal;
a second amplifier stage circuit to provide an amplifier output voltage signal according to the first stage output voltage signal;
a current source coupled to an input node of a first current mirror circuit to provide an amplifier bias current signal;
a second current mirror circuit coupled with the first amplifier stage circuit to control a first bias current flowing in the differential amplifier circuit according to the amplifier bias current signal; and
an adjustment circuit coupled to the input node of the first current mirror circuit to modify the amplifier bias current signal when the input voltage signal is near a first supply voltage or a second supply voltage.

16. The amplifier circuit of claim 15, wherein the adjustment circuit diverts bias current away from the input node of the first current mirror circuit according to a control input signal to increase the first stage gain when an input voltage signal is near a first supply voltage or a second supply voltage.

17. The amplifier circuit of claim 16, wherein the adjustment circuit includes a control input connected an input node of the first amplifier stage circuit to receive the input voltage signal as the control input signal.

18. An amplifier, comprising:
a first amplifier stage circuit, including first and second input nodes to receive a differential input voltage signal, the first amplifier stage circuit including a plurality of transistors forming a differential amplifier circuit to amplify the differential input voltage signal according to a first stage gain to provide a first stage output voltage signal;
a second amplifier stage circuit to amplify the first stage output voltage signal according to a second stage gain to provide an amplifier output voltage signal;
a current mirror circuit coupled with the first amplifier stage circuit to control a first bias current flowing in the differential amplifier circuit according to an amplifier bias current signal received at a current mirror input node; and
a bias circuit, including:
a current source to provide a bias current signal to the current mirror input node, and
an adjustment circuit to selectively sink an adjustment current from the current mirror input node to reduce the amplifier bias current signal and increase the first stage gain to counteract a decrease in the second stage gain when a voltage at the first input node is near a first supply voltage or a second supply voltage.

19. The amplifier of claim 18, wherein the adjustment circuit includes first and second transistors connected in series with one another between the current mirror input node and a supply rail node;
wherein the first transistor includes a first control terminal connected to the first input node; and
wherein the second transistor includes a drain terminal and a second control terminal connected to one another.

20. The amplifier of claim 19, wherein the adjustment circuit includes a third transistor connected between the first and second transistors, the third transistor including a third drain terminal and a third control terminal connected to one another.

* * * * *